United States Patent
Shibata (10) Patent No.: US 8,420,424 B2
(45) Date of Patent: Apr. 16, 2013

(54) METHOD FOR MANUFACTURING SEMICONDUCTOR LIGHT EMMITING DEVICE

(75) Inventor: Kyohei Shibata, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 13/239,152

(22) Filed: Sep. 21, 2011

(65) Prior Publication Data

US 2012/0190146 A1      Jul. 26, 2012

(30) Foreign Application Priority Data

Jan. 25, 2011    (JP) ................................ 2011-012985

(51) Int. Cl.
*H01L 21/00* (2006.01)
(52) U.S. Cl.
USPC ............................................. 438/39; 438/46
(58) Field of Classification Search ............. 438/39, 438/46
See application file for complete search history.

(56) References Cited

U.S. PATENT DOCUMENTS

| | | | | |
|---|---|---|---|---|
| 2006/0006408 A1* | 1/2006 | Suehiro et al. | ................ | 257/103 |
| 2006/0289883 A1* | 12/2006 | Kim et al. | ................ | 257/96 |
| 2007/0069222 A1* | 3/2007 | Ko et al. | ................ | 257/86 |
| 2008/0121907 A1* | 5/2008 | Wen et al. | ................ | 257/94 |
| 2009/0114930 A1* | 5/2009 | Kuo | ................ | 257/88 |
| 2010/0224887 A1 | 9/2010 | Shibata et al. | | |

FOREIGN PATENT DOCUMENTS

| | | |
|---|---|---|
| JP | 2001-160657 A | 6/2001 |
| JP | 2002-334830 | 11/2002 |
| JP | 2007-294885 | 11/2007 |

* cited by examiner

*Primary Examiner* — Luan C Thai
(74) *Attorney, Agent, or Firm* — Patterson & Sheridan, LLP (57) ABSTRACT

According to one embodiment, in a method for manufacturing a semiconductor light emitting device, a transparent conductive film is formed on a semiconductor laminated body of a multilayer structure containing a light emitting unit. The transparent conductive film is a film transmissive to a light of a luminescence wavelength from the light emitting unit. A mask is formed on the portion of the transparent conductive film. The transparent conductive film is removed by wet etching through the mask so as to expose the semiconductor laminated body. The semiconductor laminated body is removed by anisotropically etching through the mask so as to remove the light emitting unit. The mask is removed. A first electrode is formed on the portion of the semiconductor laminated body exposed after removing the light emitting unit. A second electrode is formed on the portion of the transparent conductive film.

18 Claims, 7 Drawing Sheets

FIG. 3B $S1/S2 \geq 0.98$

FIG. 7

METHOD FOR MANUFACTURING SEMICONDUCTOR LIGHT EMMITING DEVICE

CROSS REFERENCE TO RELATED APPLICATION

This application is based upon and claims the benefit of priority from the prior Japanese Patent Application No. 2011-12985, filed on Jan. 25, 2011, the entire contents of which are incorporated herein by reference.

FIELD

Embodiments described herein relate generally to a method for manufacturing a semiconductor light emitting device.

BACKGROUND

Conventionally, there is a nitride semiconductor light emitting device configured to uniform a distribution of a current which flows through a nitride semiconductor layer and extract a light from the nitride semiconductor layer efficiently, through a transparent conductive film formed on the nitride semiconductor layer.

Because the nitride semiconductor layer is a material of which an electric conductivity is relatively low, the transparent conductive film is used so as to improve the current spread in the nitride semiconductor layer and prevent an electrode material from shading the extracted light.

In the nitride semiconductor light emitting device, the transparent conductive film is formed on the nitride semiconductor layer, the transparent conductive film is patterned through a first mask and the nitride semiconductor layer is patterned through a second mask after removing the first mask.

Consequently, there is a problem in that manufacturing steps of the nitride semiconductor light emitting device are complicated because a photolithography process is needed twice. Furthermore, there is a problem in that a coverage factor of the transparent conductive film to the nitride semiconductor layer is lowered due to a patterning accuracy of the photolithography process.

BRIEF DESCRIPTION OF THE DRAWINGS

FIGS. 2A to 3C are cross-sectional views showing manufacturing steps of the semiconductor light emitting device in order according to the embodiment;

FIGS. 4A to 6C are cross-sectional views showing manufacturing steps of a semiconductor light emitting device of a comparative example in order according to the embodiment;

DETAILED DESCRIPTION

According to one embodiment, in a method for a semiconductor light emitting device, a transparent conductive film is formed on a semiconductor laminated body of a multilayer structure containing a light emitting unit. The transparent conductive film is a film transmissive to a light of a luminescence wavelength from the light emitting unit. A mask is formed on the portion of the transparent conductive film. The transparent conductive film is removed by wet etching through the mask so as to expose the semiconductor laminated body. The semiconductor laminated body is removed by anisotropically etching through the mask so as to remove the light emitting unit. The mask is removed. A first electrode is formed on the portion of the semiconductor laminated body exposed after removing the light emitting unit. A second electrode is formed on the portion of the transparent conductive film.

Hereinafter, one embodiment will be described with reference to the drawings. In the drawings, same reference characters denote the same or similar portions.

Embodiment

A manufacturing method for a semiconductor light emitting device of an embodiment will be described with reference to FIG. 1 to FIG. 3C.

Figure 1:
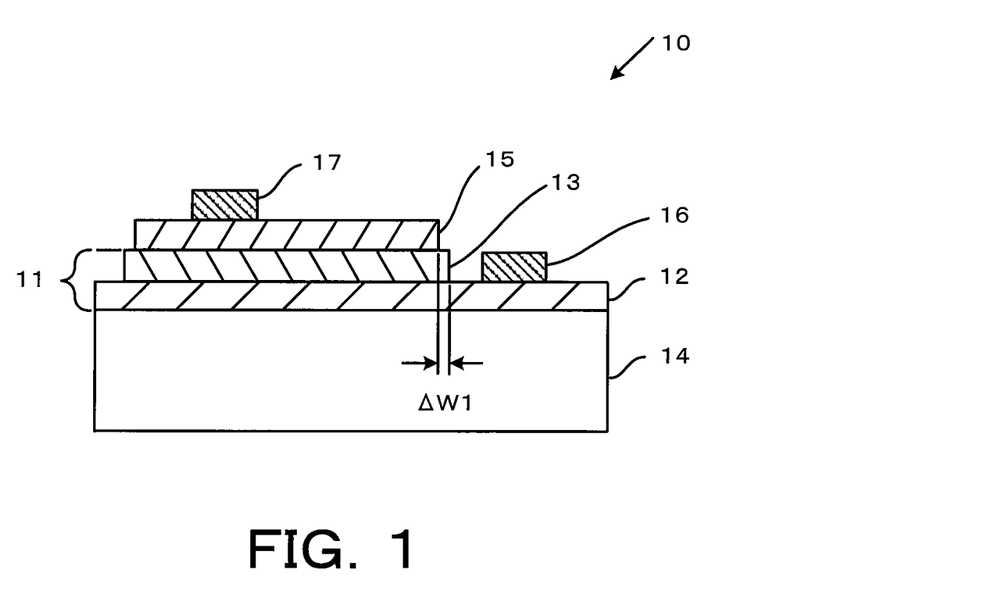
FIG. 1 is a cross-sectional view showing a semiconductor light emitting device according to an embodiment.

As shown in FIG. 1, a semiconductor light emitting device 10 is provided with a semiconductor layer 11 which is a nitride semiconductor layer (a semiconductor laminated body) of a multilayer structure containing a light emitting unit 13 formed on an N-type GaN layer 12 for example.

The semiconductor layer 11 is formed on a substrate 14 which is transmissive to a light of a luminescence wavelength from the light emitting unit 13 and has an electric insulating property, such as a sapphire substrate for example. Hereinafter, the substrate 14 is described also as the sapphire substrate 14.

The N-type GaN layer 12 is a base single crystalline layer on which the light emitting unit 13 is formed by epitaxial growth. The N-type GaN layer 12 having a thickness of approximately 3 μm for example is formed thickly on the substrate 14. The light emitting unit 13 is formed on the portion of the N-type GaN layer 12.

The light emitting unit 13 includes an N-type GaN cladding layer having a thickness of approximately 2 μm for example, a multiple quantum well (MQW) layer, a P-type GaN cladding layer having a thickness of approximately 100 nm for example, and a P-type GaN contact layer having a thickness of approximately 10 nm for example. The multiple quantum well layer is formed in such a manner that a GaN barrier layer having a thickness of approximately 5 nm for example, and an InGaN well layer having a thickness of approximately 2.5 nm for example, are stacked with each other. The top layer of the multiple quantum well layer is the InGaN well layer.

An In composition ratio x of the InGaN well layer ($In_xGa_{1-x}N$ layer, $0<x<1$) is set to approximately 0.1 so that a peak luminescence wavelength of a light extracted from the semiconductor layer 11 becomes approximately 450 nm for example.

An Indium Tin Oxide (ITO) film having a thickness of approximately 100 nm for example is formed on the top layer of the semiconductor layer 11 that is the P-type GaN contact layer as a transparent conductive film 15 which is transmissive to the light of the luminescence wavelength from the light emitting unit 13.

The transparent conductive film 15 is used so as to improve a current spread in the semiconductor layer 11 and prevent an electrode material from shading the light extracted from the light emitting unit 13. Hereinafter, the transparent conductive film 15 is described also as the ITO film 15.

The size of the transparent conductive film 15 is smaller than the size of the light emitting unit 13 of the semiconductor layer 11 only 2ΔW1. The value of 2ΔW1 is approximately 2 μm for example. The size of the transparent conductive film 15 is 318 μm when the size of the light emitting unit 13 is 320 μm. Therefore, the transparent conductive film 15 covers the top layer of the light emitting unit 13 of the semiconductor layer 11 that is the P-type GaN contact layer more than 98% in a surface area.

A first electrode (N side electrode) 16 is a laminated film of Titanium (Ti)/Platinum (Pt)/Gold (Au) for example formed on the N-type GaN layer 12.

A second electrode (P side electrode) 17 is a film of Gold (Au) or Aluminum (Al) for example formed on the transparent conductive film 15.

The light emitting device 10 of the embodiment is configured that the light emitting unit 13 of the semiconductor layer 11 is almost completely covered with the transparent conductive film 15 in the surface area so as to uniform the distribution of the current which flows through the light emitting unit 13 and prevent the electrode material from shading the extracted light.

A decrease of a light emitting efficiency and an increase of an operation voltage due to a partial increase of the current density of the light emitting unit 13 is prevented.

Furthermore, ITO itself has a high optical transmittance (more than approximately 90%) and a good ohmic contact to GaN. Therefore, an influence on device characteristics by the transparent conductive film 15, such as an increase of an optical loss by an optical absorption, an increase of an operation voltage by a contact resistance and so on, hardly occurred.

Next, the method for manufacturing the light emitting device 10 is described. FIGS. 2A to 3C are cross-sectional views showing manufacturing steps of the semiconductor light emitting device 10 in order.

Figure 2A:
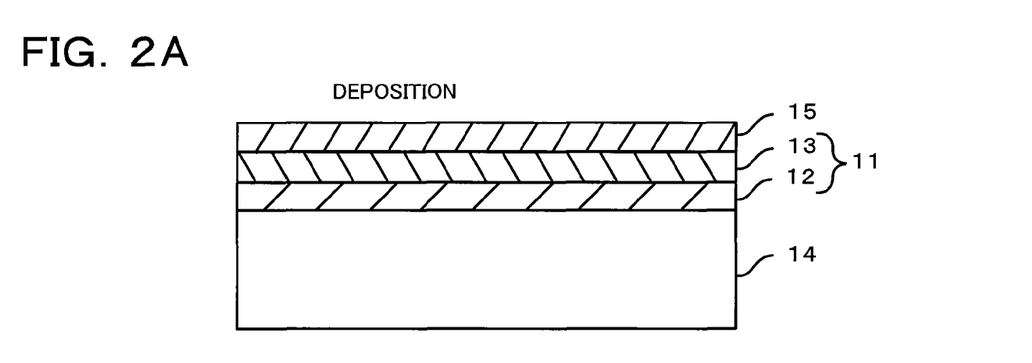

As shown in FIG. 2A, the semiconductor layer 11 is formed as follows. The N-type GaN layer 12 and the light emitting unit 13 are epitaxially grown on the substrate 14 for epitaxial growth in order by metal organic chemical vapor deposition (MOCVD).

More specifically, the semiconductor layer 11 is formed as follows for example. The sapphire substrate 14 is stored in a reactive chamber of an MOCVD system after an organic cleaning and an acid cleaning are given as a pretreatment. The substrate 14 is heated up to a temperature of approximately 1100° C. for example by high-frequency induction heating in a normal pressure mixed gas atmosphere of nitrogen ($N_2$) gas and hydrogen ($H_2$) gas for example. Therefore, the surface of the substrate 14 is thermally etching so that a natural oxide film generated on the surface of the substrate 14 is removed.

The N-type GaN layer 12 having the thickness of approximately 3 μm is formed in such a manner that a process gas of ammonia ($NH_3$) gas and tri-methyl gallium (TMG) and an N-type dopant gas of silane gas ($SiH_4$) are supplied in the reactive chamber using the mixed gas of $N_2$ gas and $H_2$ gas as a carrier gas.

After the N-type GaN cladding layer having the thickness of approximately 2 μm is formed in the same manner, the supply of $NH_3$ gas is continued and the supply of TMI and $SiH_4$ gas is stopped, the substrate 14 is cooled down up to a temperature of approximately 800° C. for example lower than 1100° C. and kept at the temperature of approximately 800° C.

The GaN barrier layer having the thickness of approximately 5 nm is formed in such a manner that the process gas of $NH_3$ gas and TMG is supplied in the reactive chamber using N2 gas as a carrier gas. The InGaN well layer having the thickness of approximately 2.5 nm and In content of approximately 0.1 is formed in a manner that tri-methyl indium (TMI) is added to the process gas.

The GaN barrier layer and The InGaN well layer are formed repeatedly seven times for example by intermitting the supply of TMI. As a result, the MQW layer is obtained.

The GaN contact layer having the thickness of approximately 5 nm is formed in such a manner that the supply of $NH_3$ gas and TMG is continued and the supply of TMI is stopped.

The supply of $NH_3$ gas is continued and the supply of TMI and $SiH_4$ gas is stopped, the substrate 14 is cooled down up to a temperature of approximately 1030° C. for example higher than 800° C. and kept at the temperature of approximately 1030° C. in an $N_2$ atmosphere.

The P-type GaN cladding layer having the thickness of approximately 100 nm and the magnesium (Mg) concentration of approximately 1E20 $cm^{-3}$ is formed in such a manner that the process gas of $NH_3$ gas and TMG and a P-type dopant gas of biscyclopentadienylmagnesium ($Cp_2Mg$) are supplied in the reactive chamber using the mixed gas of $N_2$ gas and $H_2$ gas as a carrier gas.

The P-type GaN contact layer having the thickness of approximately 10 nm and the magnesium (Mg) concentration of approximately 1E21 $cm^{-3}$ is formed in such a manner that the supply of $Cp_2Mg$ is increased.

The supply of TMG is stopped continuing the supply of $NH_3$ gas, only the carrier gas is supplied continuously, the substrate 14 is cooled down naturally. The supply of $NH_3$ gas is continued until the temperature of the substrate 14 becomes 500° C. As a result, the semiconductor layer 11 is formed on the sapphire substrate 14, the P-type GaN contact layer becomes top layer.

The ITO film 15 is formed on the P-type GaN contact layer by sputtering method for example. Generally, it is known that an ITO film in which an amorphous ITO and a crystalline ITO are mixed is obtained depending on a substrate temperature, a plasma density, a partial pressure of oxygen and so on when the ITO film is formed by sputtering method.

As for the substrate temperature for example, a crystallization temperature of the ITO is approximately between 150° C. and 200° C. When the substrate temperature is near to the crystallization temperature of the ITO, the ITO film in which the amorphous ITO and the crystalline ITO are mixed is obtained.

Figure 2B:
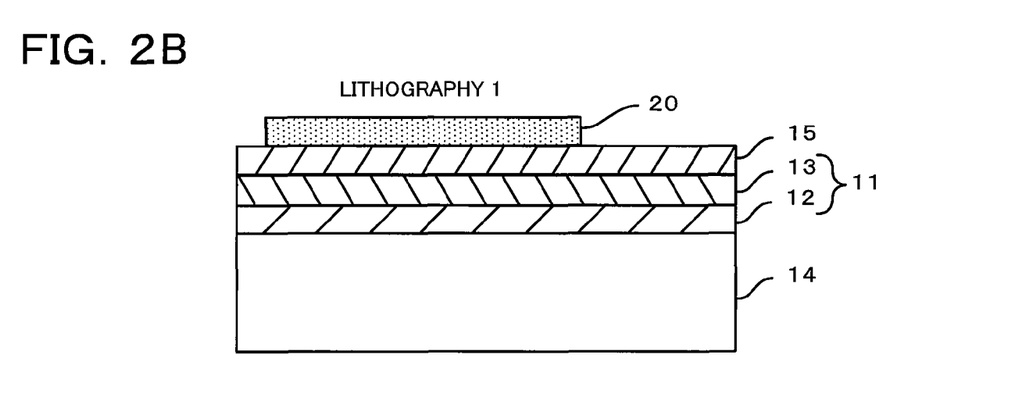

As shown in FIG. 2B, a resist film 20 is formed on the ITO film 15 as a mask material by photolithography method so that the ITO film 15 is patterned to an electrode shape.

Figure 3A:
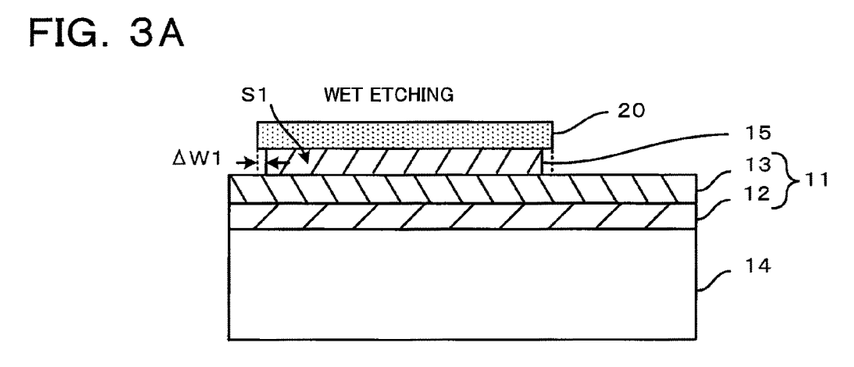

As shown in FIG. 3A, the ITO film 15 is wet etched by a mixed acid of hydrochloric acid and nitric acid through the resist film 20 as a mask. The etching is performed until both the amorphous ITO and the crystalline ITO are removed.

The etching rate of the crystalline ITO is lower than the etching rate of the amorphous ITO. The etching rate of the crystalline ITO is approximately 50 nm/min to 100 nm/min for example. The etching rate of the amorphous ITO is approximately 100 nm/min to 500 nm/min for example.

The ITO film 15 is undercut approximately 1 μm for example. ΔW1 as shown in FIG. 1 denotes the width of the undercut. On the other hand, the resist film 20 does not become thin because the resist film 20 is unetched. An initial thickness of the resist film 20 is maintained.

The crystalline ITO is easy to remain as a residue. It is preferable to etch the ITO film 15 while applying an ultrasonic wave or to remove the residue of the crystalline ITO physically by ultrasonic cleaning after etched.

Figure 3B:
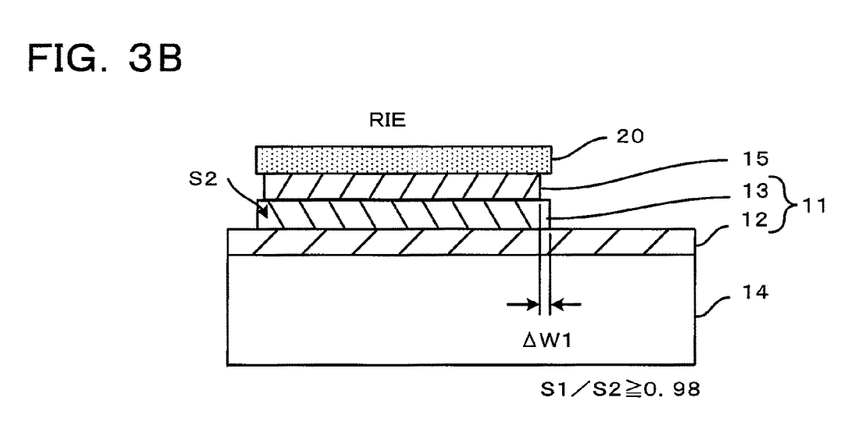

As shown in FIG. 3B, the resist film 20 is remaining without being removed. The light emitting unit 13 of the semiconductor layer 11 is anisotropically etched through the remaining resist film 20. The anisotropic etching is performed by reactive ion etching (RIE) method using a gas of a chlorine system so as to expose the N-type GaN layer 12.

Although an etching depth of RIE is approximately 1 μm, the width of the undercut of the light emitting unit 13 is suppressed to approximately 100 nm. Therefore, the difference between the size of the ITO film 15 and the size of light-emitting unit 13 is equal to approximately 2ΔW1.

Here, the area of the ITO film 15 is assumed to be S1 and the area of the light emitting unit 13 is assumed to be S2. A ratio of the area S1 of the ITO film 15 to the area S2 of the light emitting unit 13 becomes 0.98 or more.

Figure 3C:
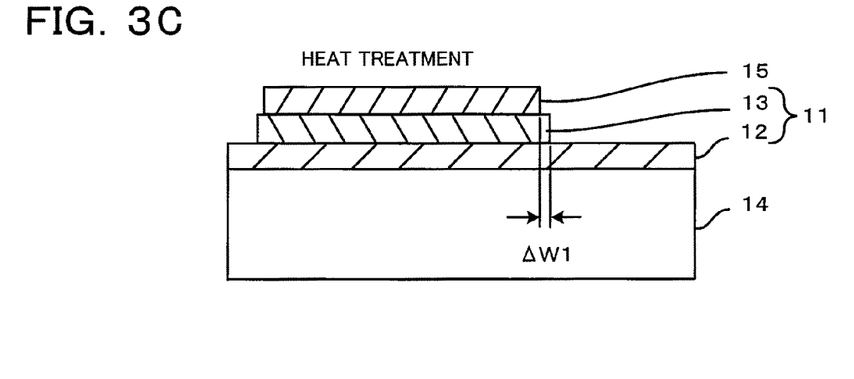

As shown in FIG. 3C, the resist film 20 is removed by ashing for example so as to expose the ITO film 15 patterned after the electrode shape.

The ITO film is heat-treated so as to promote the crystallization of the ITO film 15 and improve the electric conductivity of the ITO film 15. For example, following conditions are suitable for the heat treatment. A temperature of heat treatment is 400° C. to 500° C., a time of heat treatment is 1 min to 20 min and an atmosphere of heat treatment is nitrogen or a mixed atmosphere of nitrogen and oxygen.

The N side electrode is formed on the N-type GaN 12 and the P side electrode is formed on the ITO film 15. The substrate 14 is diced using a blade so as to become chips. As a result, the light emitting device 10 shown in FIG. 1 is obtained.

Next, a method for manufacturing a light emitting device of a comparative example will be described with reference to FIGS. 4a to 6C. Here, the method for manufacturing the light emitting device of the comparative example means how to perform a wet etching through a first mask and a reactive ion etching through a second mask.

Figure 4A:
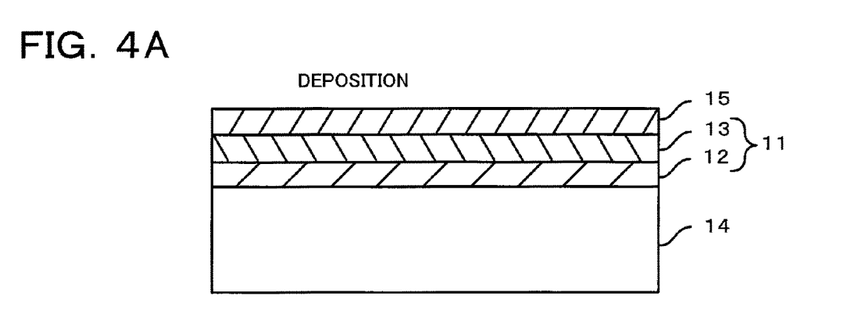

As shown in FIG. 4A, the semiconductor layer 11 is formed on the substrate 14 and the transparent conductive film 15 is formed on the semiconductor layer 11 in the same manner shown in FIG. 2A.

Figure 4B:
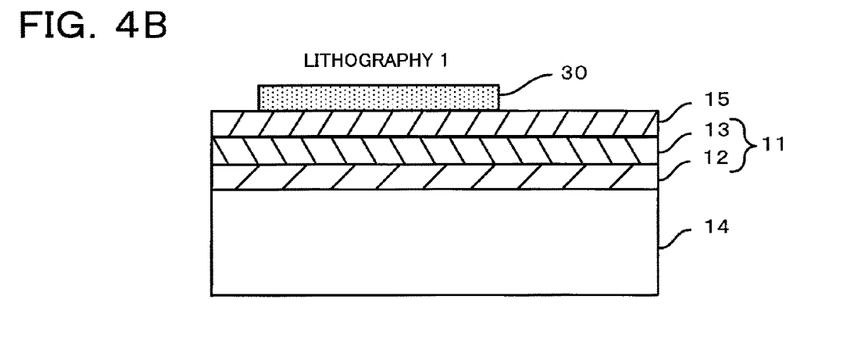

As shown in FIG. 4B, a resist film 30 having the electrode shape is formed by photolithography method in the same manner shown in FIG. 2B. The resist film 30 is formed somewhat smaller than the resist film 20 shown in FIG. 2B so that the size of the light emitting unit 13 becomes the same as the size of the light emitting unit 13 shown in FIG. 3B.

Figure 5A:
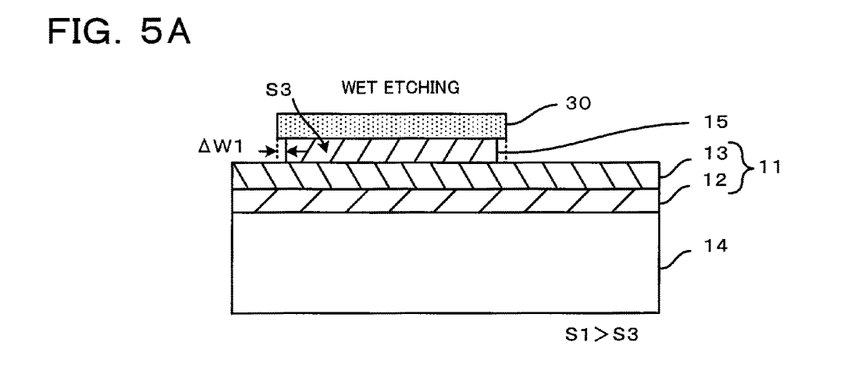

As shown in FIG. 5A, the transparent conductive film 15 is wet-etched through the resist film 30 as a mask in the same manner shown in FIG. 3A. The transparent conductive film 15 is undercut only ΔW1. The area S3 of the transparent conductive film 15 is smaller than the area S1 of the transparent conductive film 15 shown in FIG. 3A.

Figure 5B:
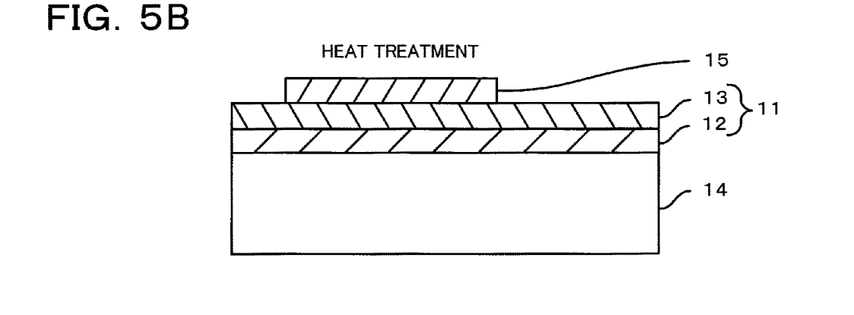

As shown in FIG. 5B, the transparent conductive film 15 is heat-treated after removing the resist film 30 by ashing for example.

Figure 5C:
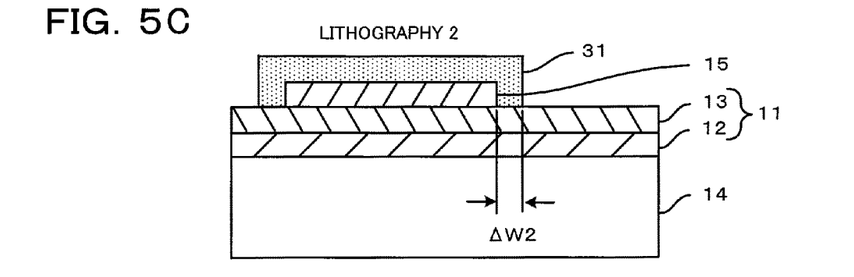

As shown in FIG. 5C, a resist film 31 is formed on the transparent conductive film 15. It is suitable that the resist film 31 is formed to cover essentially only the upper surface of the transparent conductive film 15. But, not only the upper surface of the transparent conductive film 15 but also sidewalls of the transparent conductive film 15 are covered with the resist film 31 due to a patterning accuracy of the lithography process.

As a result, the size of the resist film 31 becomes larger than the size of the transparent conductive film 15 only 2*ΔW2. ΔW2 denotes a thickness of the resist film 31 with which sidewalls of the transparent conductive film 15 are covered. 2*ΔW2 is 10 μm when ΔW2 is 5 μm for example. Therefore, it is required that the size of the resist film 30 is beforehand made smaller than the size of the resist film 20 only 2*ΔW2 so that the size of the resist film 31 becomes substantially equal to the size of the resist film 20 shown in FIG. 2B.

Figure 6A:
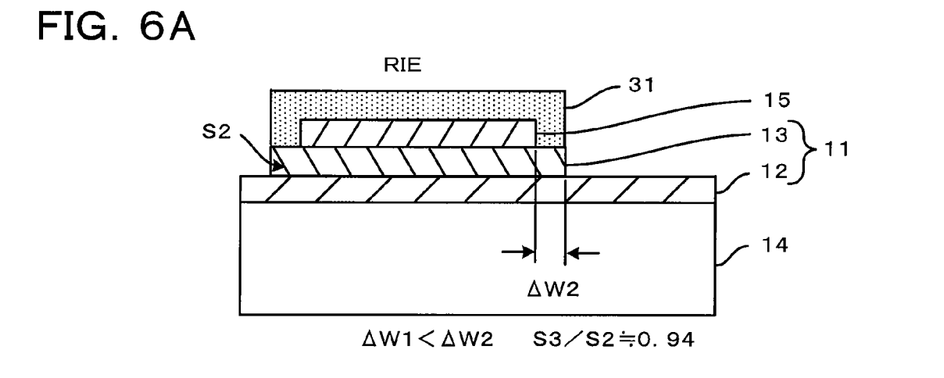

As shown in FIG. 6A, the light emitting unit 13 is anisotropically etched by RIE method through the resist film 31 as a mask so as to expose the N-type GaN layer 12. As a result, a ratio (S3/S2) of the area S3 of the ITO film 15 to the area S2 of the light emitting unit 13 decreases to 0.94 because the size of the transparent conductive film 15 is smaller than the size of the light emitting unit 13 only 2*ΔW2.

Figure 6B:
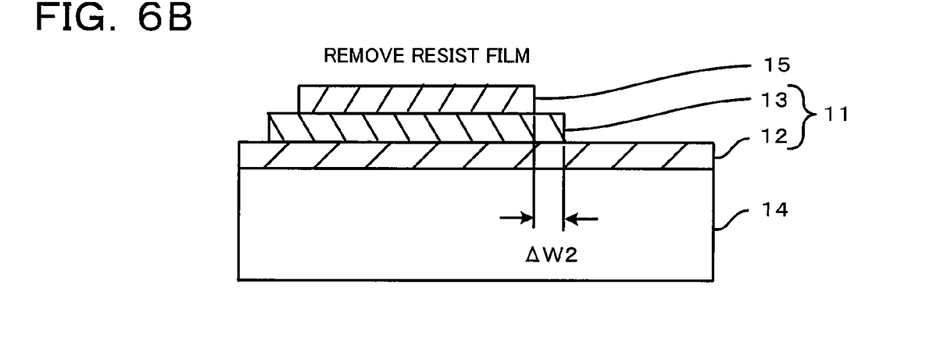
Figure 6C:
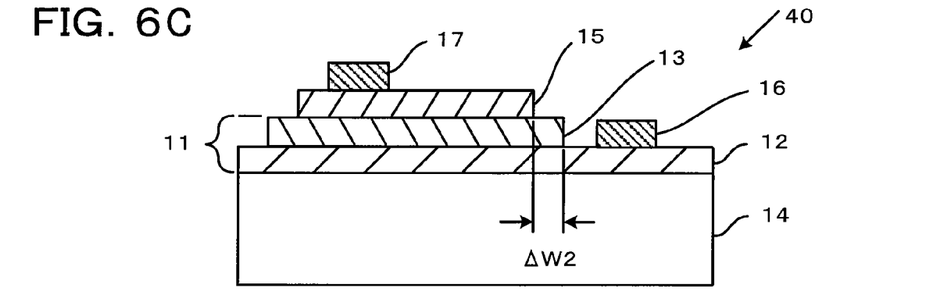

As shown in FIG. 6B, the resist film 31 is removed. As shown in FIG. 6C, N side electrode 16 is formed on the N-type GaN layer 12 and P side electrode 17 is formed on the ITO film 15. Therefore, the light emitting device 40 of the comparative example is obtained.

The photolithography process is required twice in the method for manufacturing the light emitting device of the comparative example. The transparent conductive film 15 is not formed up to the periphery of the light emitting unit 13 because the area S3 of the transparent conductive film 15 is smaller than the area S1.

A current distribution of the light emitting unit 13 becomes nonuniform because the current is hard to flow through the periphery. When the current distribution is nonuniform, there are problems in that a light emitting efficiency decreases and the operation voltage increases because the current density partially increases.

On the other hand, the photography process is required only once in the method for manufacturing the light emitting device of the embodiment. The transparent conductive film 15 is formed up to the periphery of the light emitting unit 13 because the area S1 of the transparent conductive film 15 is almost equal to the area S2.

A current distribution of the light emitting unit 13 becomes uniform because the current flows through the periphery. The problems caused when the current density is nonuniform can be prevented beforehand.

Figure 7:
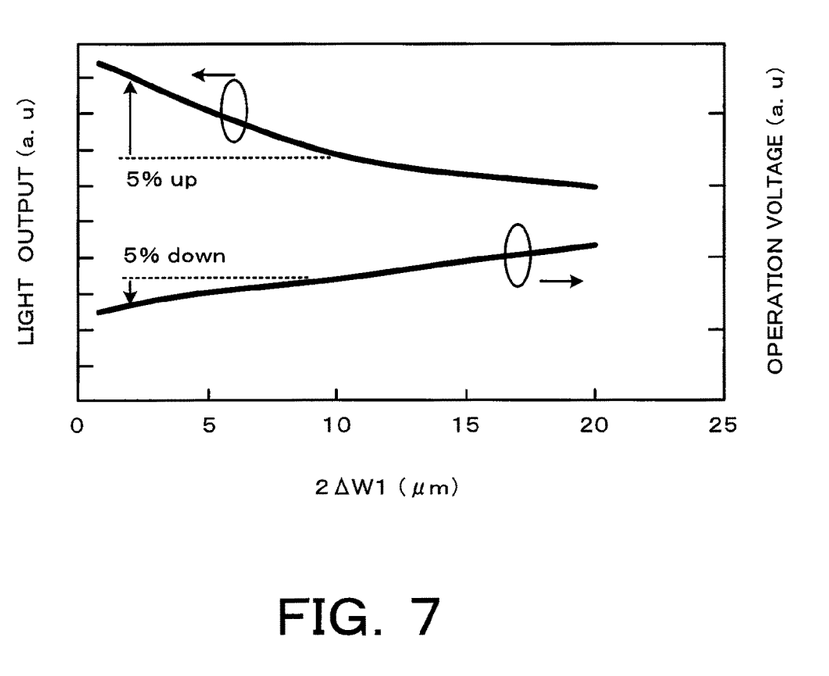
FIG. 7 is a graph showing characteristics of the semiconductor light emitting device according to the embodiment.

FIG. 7 shows the relation between characteristics of the semiconductor light emitting device 10 and 2*ΔW1. In FIG. 7, a horizontal axis shows 2*ΔW1, a left-vertical axis shows light output and a right-vertical axis shows operation voltage. As shown in FIG. 7, generally, the light output increases and the operation voltage decreases in accordance with a decrease of 2*ΔW1. In the light emitting device 10, it is expected that a light output is improved from approximately 3% to 5% because the light emitting area improved by 5% compared with the light emitting device 40. Further, it is expected that the operation voltage is improved to approximately 5%.

As described above, in the method for manufacturing the light emitting device 10 of the embodiment, the transparent conductive film 15 is wet-etched through the resist film 20 as a mask and the light emitting unit 13 is anisotropically etched through the resist film 20 as a mask.

Consequently, the photography process is required only once. The transparent conductive film 15 can be formed on almost all the upper surface of the light emitting unit 13. Accordingly, it is possible to obtain the method for manufacturing the light emitting device which improves the coverage factor of the transparent conductive film.

Here, description has been given of the case where the mask materials 20, 30, 31 are the resist films. However, other mask material such as a silicon oxide film may be used.

Description has been given of the case where the substrate 14 is the sapphire substrate. However, a SiC substrate and a GaN substrate may be used. When the substrate is the SiC substrate or the GaN substrate, the first electrode is formed on the rear surface of the substrate because the substrates have an electric conductivity.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A method for manufacturing a semiconductor light emitting device, comprising:
    forming a transparent conductive film on a semiconductor laminated body of a multilayer structure containing a light emitting unit, the transparent conductive film being a film transmissive to a light of a luminescence wavelength from the light emitting unit;
    forming a mask on the portion of the transparent conductive film;
    removing the transparent conductive film by wet etching through the mask so as to expose the semiconductor laminated body;
    removing the semiconductor laminated body by anisotropically etching through the mask so as to remove the light emitting unit;
    removing the mask; and
    forming a first electrode on the portion of the semiconductor laminated body exposed after removing the light emitting unit and a second electrode on the portion of the transparent conductive film.

2. The method of claim 1, wherein the transparent conductive film is heat-treated after removing the mask.

3. The method of claim 1, wherein the semiconductor laminated body is a nitride semiconductor laminated body.

4. The method of claim 1, wherein the transparent conductive film is an indium tin oxide.

5. The method of claim 1, wherein a ratio of a first area to a second area is more than 0.98, the first area is a residual area of the transparent conductive film after wet etching, the second area is a residual area of the light emitting unit after anisotropically etching.

6. The method of claim 1, wherein the transparent conductive film is easy to undercut during wet etching of the transparent conductive film, the semiconductor laminated body is hard to undercut during anisotropic etching of the semiconductor laminated body.

7. The method of claim 1, wherein a ratio of a first undercut width of the transparent conductive film to a second undercut width of the semiconductor laminated body is more than 10.

8. The method of claim 4, wherein the transparent conductive film is formed by sputtering method.

9. The method of claim 4, wherein the indium tin oxide film is a film in which a crystalline indium tin oxide and an amorphous indium tin oxide are mixed, the wet etching is performed until both the crystalline indium tin oxide and the amorphous indium tin oxide are removed.

10. The method of claim 4, wherein the wet etching of the indium tin oxide film is performed by a chemical solution containing hydrochloric acid and nitric acid.

11. The method of claim 3, wherein the anisotropic etching of the nitride semiconductor laminated body is performed by reactive ion etching method using a gas of a chlorine system.

12. The method of claim 3, wherein the light emitting unit includes an N-type GaN cladding layer, a multiple quantum well layer, a P-type GaN cladding layer and a P-type GaN contact layer, the multiple quantum well layer is formed in such a manner that a GaN barrier layer and an InGaN well layer are stacked with each other.

13. A method for manufacturing a semiconductor light emitting device, comprising:
    forming an indium tin oxide film on a nitride semiconductor laminated body of a multilayer structure containing a light emitting unit, the indium tin oxide film being a film transmissive to a light of a luminescence wavelength from the light emitting unit;
    forming a mask on the portion of the indium tin oxide film;
    removing the indium tin oxide film by wet etching through the mask so as to expose the nitride semiconductor laminated body;
    removing the nitride semiconductor laminated body by anisotropically etching through the mask so as to remove the light emitting unit;
    removing the mask; and
    forming a first electrode on the portion of the nitride semiconductor laminated body exposed after removing the light emitting unit and a second electrode on the portion of the indium tin oxide film.

14. The method of claim 13, wherein the indium tin oxide film is heat-treated after removing the mask.

15. The method of claim 13, wherein a ratio of a first area to a second area is more than 0.98, the first area is a residual area of the indium tin oxide film after wet etching, the second area is a residual area of the light emitting unit after anisotropically etching.

16. The method of claim 13, wherein the indium tin oxide film is easy to undercut during wet etching of the indium tin oxide film, the nitride semiconductor laminated body is hard to undercut during anisotropic etching of the nitride semiconductor laminated body.

17. The method of claim 13, wherein a ratio of a first undercut width of the indium tin oxide film to a second undercut width of the nitride semiconductor laminated body is more than 10.

18. The method of claim 13, wherein the light emitting unit includes an N-type GaN cladding layer, a multiple quantum well layer, a P-type GaN cladding layer and a P-type GaN contact layer, the multiple quantum well layer is formed in such a manner that a GaN barrier layer and an InGaN well layer are stacked with each other.

* * * * *